United States Patent
Benedict et al.

(10) Patent No.: US 10,180,888 B2
(45) Date of Patent: Jan. 15, 2019

(54) MEMORY SPARING ON MEMORY MODULES

(71) Applicant: HEWLETT PACKARD ENTERPRISE DEVELOPMENT LP, Houston, TX (US)

(72) Inventors: Melvin K Benedict, Magnolia, TX (US); Eric L Pope, Tomball, TX (US); Andrew C. Walton, Rocklin, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 72 days.

(21) Appl. No.: 14/912,130

(22) PCT Filed: Sep. 27, 2013

(86) PCT No.: PCT/US2013/062396
§ 371 (c)(1),
(2) Date: Feb. 15, 2016

(87) PCT Pub. No.: WO2015/047332
PCT Pub. Date: Apr. 2, 2015

(65) Prior Publication Data
US 2016/0203065 A1 Jul. 14, 2016

(51) Int. Cl.
*G06F 11/00* (2006.01)
*G06F 11/20* (2006.01)
(Continued)

(52) U.S. Cl.
CPC ........ *G06F 11/2038* (2013.01); *G06F 3/0619* (2013.01); *G06F 3/0656* (2013.01);
(Continued)

(58) Field of Classification Search
CPC ............. G06F 11/2038; G06F 11/2069; G06F 11/1446; G06F 11/1016; G06F 11/2058;
(Continued)

(56) References Cited

U.S. PATENT DOCUMENTS 5,323,353 A * 6/1994 Griffus ................... G11C 29/70
365/189.15
6,195,771 B1 2/2001 Tanabe et al.
(Continued)

FOREIGN PATENT DOCUMENTS

CN 101202106 6/2008
TW 201225095 6/2012

OTHER PUBLICATIONS

Wikipedia "Forward Error Correction" page, from May 11, 2013, retrieved using the way back machine from https://web.archive.org/web/20130511044841/https://en.wikipedia.org/wiki/Forward_error_correction.*

(Continued)

*Primary Examiner* — Yair Leibovich
(74) *Attorney, Agent, or Firm* — Hewlett Packard Enterprise Patent Department

(57) ABSTRACT

Example implementations relate to using a spare memory on a memory module. In example implementations, a memory module may have a plurality of memories, including default memories and a spare memory. A plurality of data buffers on the memory module may select data nibbles from the plurality of memories such that when a default memory is identified as defective, a data nibble is selected from the spare memory and not from the defective default memory. A data nibble selected from the default memory may be in a first position in an output of the memory module when the default memory is functional. A data nibble selected from the spare memory may be in a second position in the output of the memory module.

8 Claims, 8 Drawing Sheets

(51) Int. Cl.
*G06F 3/06* (2006.01)
*G06F 11/10* (2006.01)
*G06F 11/14* (2006.01)
*G11C 7/10* (2006.01)
*G11C 29/00* (2006.01)

(52) U.S. Cl.
CPC ........ *G06F 3/0683* (2013.01); *G06F 11/1016* (2013.01); *G06F 11/1446* (2013.01); *G06F 11/2058* (2013.01); *G06F 11/2069* (2013.01); *G11C 7/1012* (2013.01); *G11C 7/1033* (2013.01); *G11C 29/846* (2013.01); *G06F 2201/84* (2013.01)

(58) Field of Classification Search
CPC .... G06F 3/0619; G06F 3/0683; G06F 3/0656; G06F 2201/84; G11C 7/1033; G11C 29/846; G11C 7/1012
USPC ........................................................ 714/6.3
See application file for complete search history.

(56) References Cited

U.S. PATENT DOCUMENTS

| | | | |
|---|---|---|---|
| 6,373,758 B1 | 4/2002 | Hughes et al. | |
| 6,741,512 B2 | 5/2004 | Kim et al. | |
| 7,589,552 B1 | 9/2009 | Guzman et al. | |
| 8,040,727 B1 | 10/2011 | Harari | |
| 2005/0283581 A1 | 12/2005 | Chang | |
| 2008/0126876 A1 | 5/2008 | Lee | |
| 2010/0005335 A1 | 1/2010 | Ferraiolo et al. | |
| 2010/0106904 A1* | 4/2010 | Berke | G06F 11/1441 711/114 |
| 2010/0115215 A1* | 5/2010 | Rosychuk | G06F 11/1456 711/162 |
| 2010/0250966 A1* | 9/2010 | Olson | G06F 9/30018 713/190 |
| 2011/0164450 A1 | 7/2011 | Norman | |
| 2012/0023309 A1* | 1/2012 | Abraham | G06F 11/00 712/30 |
| 2012/0069659 A1 | 3/2012 | Han et al. | |
| 2013/0028035 A1 | 1/2013 | Kono | |
| 2013/0069659 A1 | 3/2013 | Iwasaki et al. | |
| 2014/0192583 A1* | 7/2014 | Rajan | G11C 7/10 365/63 |

OTHER PUBLICATIONS

International Searching Authority, The International Search Report and the Written Opinion for PCT/US2013/062396 dated Jun. 25, 2014, 9 Pages.

Nair, P.J., et al.; "Archshield: Architectural Framework for Assisting DRAM Scaling by Tolerating High Error Rates"; Apr. 22, 2013; 12 pages.

* cited by examiner

US 10,180,888 B2

MEMORY SPARING ON MEMORY MODULES

BACKGROUND

Thousands of memory dies may reside on memory modules in a server. Error correction logic may be used to correct errors detected in the memory dies. Memory modules may include extra memory dies so that when a memory die on a memory module malfunctions, an extra memory die may be used instead of the entire memory module having to be replaced.

BRIEF DESCRIPTION OF THE DRAWINGS

The following detailed description references the drawings, wherein.

DETAILED DESCRIPTION

As memory die density on memory modules increases, the difficulty of routing data to and from an extra memory on a memory module may increase. The present disclosure provides for data buffers, on memory modules, having data selectors that may select data from various memories, including a spare memory. The data selectors may be configured in various ways depending on the location of a malfunctioning memory. The configurability of the data selectors may simplify the routing challenge of using extra memories, reducing the rate at which entire memory modules need to be replaced.

Figure 1:
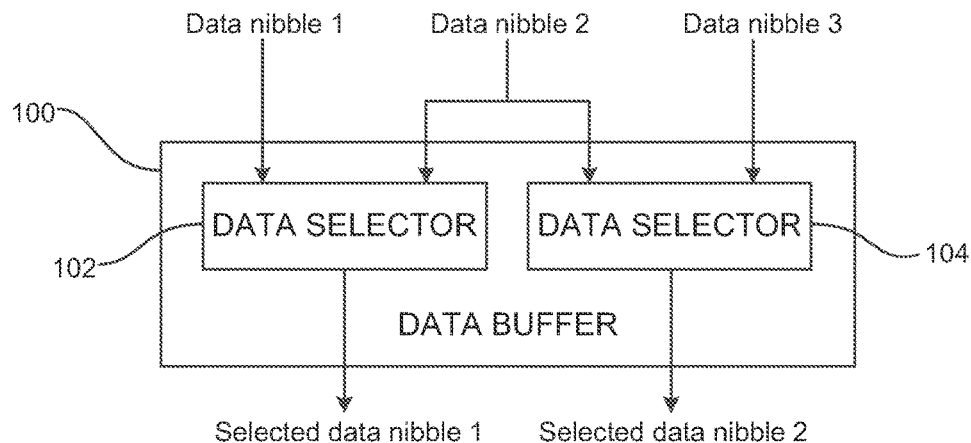
FIG. 1 is a block diagram of an example data buffer that enables selections of various combinations of data nibbles.

Referring now to the drawings, FIG. 1 is a block diagram of an example data buffer 100 that enables selections of various combinations of data nibbles. Data buffer 100 may select data nibbles from memories on a memory module. The memories may include volatile memories, such as dynamic random-access memory (DRAM), and/or non-volatile memories, such as flash memory.

In FIG. 1, data buffer 100 includes data selector 102 and data selector 104. In some implementations, data selectors 102 and 104 may include multiplexers (e.g., 2-to-1 multiplexers). Data selector 102 may select between a data nibble (e.g., Data nibble 1) stored in a first memory, and a data nibble (e.g., Data nibble 2) stored in a second memory. The term "data nibble" as used herein refers to a unit of data that is more than one bit but less than a byte. For example, a data nibble may be four bits. Data selector 104 may select between a data nibble (e.g., Data nibble 3) stored in a third memory, and the data nibble stored in the second memory (e.g., Data nibble 2). The first, second, and third memories may be on integrated circuits (ICs) on a memory module. Data selector 102 may be communicatively coupled to the first and second memories, and data selector 104 may be communicatively coupled to the second and third memories.

Selections of data selectors 102 and 104 may be determined based on whether the first and second memories on the memory module are functional. The term "functional" as used herein refers to a memory that accurately stores data that is written to the memory, and that accurately outputs stored data when a read operation is performed on the memory. When the first memory and the second memory are functional, data selector 102 may select a data nibble (e.g., Data nibble 1) stored in the first memory, and data selector 104 may select a data nibble (e.g., Data nibble 2) stored in the second memory. When the first memory is not functional, data selector 102 may select the data nibble (e.g., Data nibble 2) stored in the second memory, and data selector 104 may select a data nibble (e.g., data nibble 3) stored in the third memory. When the second memory is not functional, data selector 102 may select the data nibble (e.g., Data nibble 1) stored in the first memory, and data selector 104 may select the data nibble (e.g., data nibble 3) stored in the third memory. Data selectors 102 and 104 may receive selection control signals from a system controller on the memory module.

An output of data buffer 100 may include data nibbles selected by data selectors 102 and 104. In some implementations, data buffer 100 may provide an 8-bit (i.e., 1-byte) output. The first four bits of the output may be the data nibble (e.g., Selected data nibble 1) selected by data selector 102, and the last four bits of the output may be the data nibble (e.g., Selected data nibble 2) selected by data selector 104.

Figure 2:
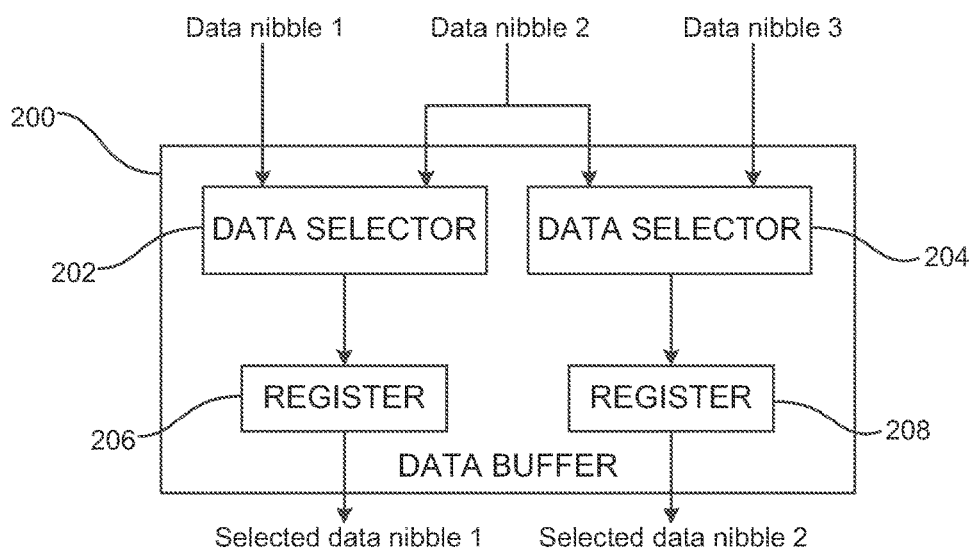
FIG. 2 is a block diagram of an example data buffer that includes registers to store outputs of data selectors in the data buffer.

FIG. 2 is a block diagram of an example data buffer 200 that includes registers to store outputs of data selectors in the data buffer. Data buffer 200 may include data selectors 202 and 204, which may be analogous to (e.g., have functions and/or components similar to) data selectors 102 and 104, respectively, of FIG. 1. Data buffer 200 may also include registers 206 and 208. Register 206 may store an output of data selector 202. The output of data selector 202 may include a data nibble (e.g., Data nibble 1 or 2) selected by data selector 202. Register 208 may store an output of data selector 204. The output of data selector 204 may include a data nibble (e.g., Data nibble 2 or 3) selected by data selector 204.

Registers 206 and 208 may output their respective stored data nibbles, and an output of data buffer 200 may include the data nibbles output by registers 206 and 208. For example, register 206 may output selected data nibble 1, and register 208 may output selected data nibble 2. Each selected data nibble may be four bits long. Data buffer 200 may provide an 8-bit (i.e., 1-byte) output; the first four bits of the output may be selected data nibble 1, and the last four bits of the output may be selected data nibble 2.

Figure 3:
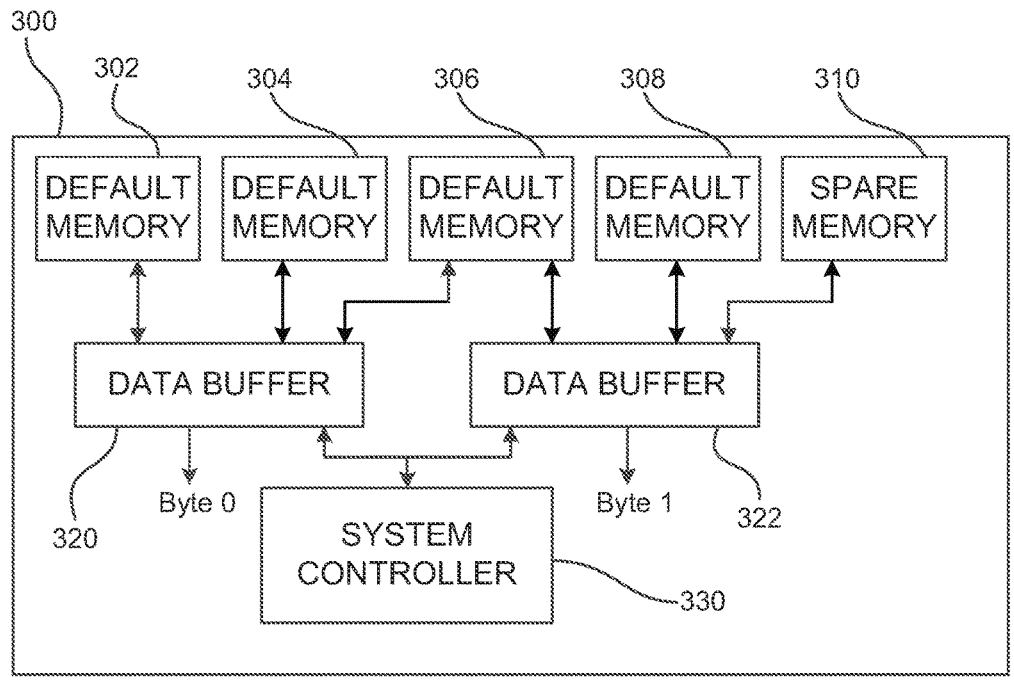
FIG. 3 is a block diagram of an example memory module that includes data buffers to select various combinations of data nibbles stored in memories on the memory module.

FIG. 3 is a block diagram of an example memory module 300 that includes data buffers to select various combinations of data nibbles stored in memories on the memory module. Memory module 300 may be an in-line memory module, such as a single in-line memory module (SIMM) or a dual in-line memory module (DIMM), or any memory module suitable for mounting memory integrated circuits (ICs). In FIG. 3, memory module 300 includes default memories 302, 304, 306, and 308, spare memory 310, data buffers 320 and 322, and system controller 330.

Memories 302, 304, 306, 308, and 310 may include volatile (e.g., DRAM) or non-volatile (e.g., flash, read-only memory) memories, and may be on ICs on memory module 300. Memories 302, 304, 306, and 308 may be default memories on memory module 300. The term "default memory" as used herein refers to a memory on which read and write operations are regularly performed. Memory 310 may be a spare memory on memory module 300. The term "spare memory" as used herein refers to a memory used to replace a default memory when a default memory does not accurately store or output data. The term "defective" may be used in the present disclosure to describe a memory or portion of a memory that does not accurately store data that is written to the memory, and/or that does not accurately output stored data when a read operation is performed on the memory. In some implementations, memories 302, 304, 306, 308, and 310 may be volatile memories having error-correcting code (EGO) functionality.

Data buffers 320 and 322 on memory module 300 may be analogous to data buffer 100 or data buffer 200. The data buffers may perform read and write operations on the memories on memory module 300. Data buffer 320 may be communicatively coupled to default memories 302, 304, and 306. Data buffer 322 may be communicatively coupled to default memories 306 and 308, and to spare memory 310. Each data buffer on memory module 300 may select two data nibbles (i.e., a data buffer may select data nibbles from two of the three memories to which the data buffer is coupled). A data strobe signal may be associated with each data nibble, and each data strobe signal may be associated with a pin on memory module 300. It should be understood that memory module 300 may have more or less memories (e.g., memory module 300 may have more than one spare memory) and/or data buffers than shown in FIG. 3, and that discussions herein regarding the memories and/or data buffers shown in FIG. 3 may be applicable to additional memories and/or data buffers.

When all default memories on memory module 300 are functional, data buffer 320 may select a data nibble stored in default memory 302 and a data nibble stored in default memory 304, and data buffer 322 may select a data nibble stored in default memory 306 and a data nibble stored in default memory 308. When a default memory, or a portion of a default memory, is determined to be defective, data buffers 320 and 322 may select data nibbles from functional default memories and from spare memory 310, and may not select a data nibble from the default memory that is defective or that has a defective portion. For example, if default memory 302 is defective, data buffer 320 may select a data nibble from default memory 304 and a data nibble from default memory 306, and data buffer 322 may select a data nibble from default memory 308 and a data nibble from spare memory 310.

Data buffer 320 may provide an 8-bit output, for example Byte 0. Similarly, data buffer 322 may provide an 8-bit output, for example Byte 1. An output of memory module 300 may include outputs of the data buffers in a specified order. For example, memory module 300 may have a 16-bit output; the first eight bits of the output may be the two data nibbles (e.g., Byte 0) outputted by data buffer 320, and the last eight bits of the output may be the two data nibbles (e.g., Byte 1) outputted by data buffer 322. Each bit outputted by a data buffer may be associated with a pin on memory module 300. The outputs of the data buffers may include the data nibbles selected by the data buffers from memories on memory module 300. An output of memory module 300 may be a cache line made up of Byte 0 and Byte 1, each byte being made up of the data nibbles selected by the respective data buffer.

When all default memories on memory module 300 are functional, a data nibble selected from default memory 302 may be the first four bits of Byte 0, a data nibble selected from default memory 304 may be the last four bits of Byte 0, a data nibble selected from default memory 306 may be the first four bits of Byte 1, and a data nibble selected from default memory 308 may be the last four bits of Byte 1. When a default memory on memory module 300 is defective, a data nibble may be selected from spare memory 310, and a data nibble may not be selected from the defective default memory. The data nibble selected from spare memory 310 may be the last four bits of Byte 1 (e.g., the last four bits of an output of memory module 300), and data nibbles selected from functional default memories may be shifted in the output of memory module 300, relative to an output of memory module 300 produced when all data nibbles are selected from default memories (i.e., when all default memories are functional).

For example, when all default memories shown in FIG. 3 are functional, data nibbles selected from default memories 306 and 308 may be the first four bits of Byte 1 and the last four bits of Byte 1, respectively, but when default memory 304 is defective, data nibbles selected from default memories 306 and 308 may be the second four bits of Byte 0 and the first four bits of Byte 1, respectively, since a data nibble may not be selected from default memory 304 (a data nibble selected from default memory 302 may be the first four bits of Byte 0 in both cases). As illustrated by this example, when a default memory in a memory module is defective, data bits selected from default memories between the defective default memory and a spare memory may shift by four bits in an output of the memory module, relative to an output of the memory module when all default memories are functional. Data nibbles selected from default memories on the other side of the defective default memory may appear in the same position in the output of the memory module in both cases.

In some implementations, a first portion of a default memory may be defective, and a second portion of the same default memory may be functional. In such implementations, when the address of a data nibble to be read from the default memory refers to a location in the defective portion, data buffers 320 and 322 may read and select a data nibble stored in a spare memory (e.g., spare memory 310), and may not select a data nibble from the default memory. When the address of a data nibble to be read from the default memory refers to a location in the functional portion, data buffers 320 and 322 may read and select the data nibble stored in the default memory, and may not select a data nibble from the spare memory.

Machine-readable instructions (e.g., software) on memory module 300 may determine which memories data nibbles should be selected from, and may specify selection control signals accordingly. System controller 330 on memory module 300 may be notified of the selection control signals. For example, machine-readable instructions may write the selection control signals into internal registers within system controller 330. System controller 330 may transmit the selection control signals to data buffers 320 and 322. The selection control signals may be used to configure data selectors in the data buffers.

System controller 330 may be communicatively coupled to data buffers 320 and 322 via a data bus, which may carry selection control signals as well as control signals for directional timing and/or on die termination (ODT). System controller 330 may control routing of data on memory module 300. In some implementations, system controller 330 may buffer control signals from a memory controller external to memory module 300. The external memory controller may receive data (e.g., Byte 0, Byte 1) that is output by the data buffers on memory module 300.

A memory controller that receives a data output from memory module 300 may detect an error in the output and/or detect a defect in a default memory on memory module 300. The memory controller may determine the severity of the error and whether a defective default memory should continue to be used. The memory controller may determine which byte or data nibble of a memory controller output has an error, and identify a memory from which erroneous data was read. Machine-readable instructions (e.g., software and/or firmware) on the memory controller and/or on memory module 300 may determine a range of memory addresses that exhibits errors.

In some implementations, an external memory controller communicatively coupled to memory module 300 may not be informed of the presence of a spare memory on memory module 300. When an error is detected in the memory module output, machine-readable instructions (e.g., software) on the memory controller may correct the error (e.g., using ECC logic) and store a copy of the corrected data in a temporary location (e.g., a buffer, virtual memory). The machine-readable instructions may also determine selection control signals for data buffers on memory module 300 such that a data nibble is not selected from the defective default memory and a data nibble is selected from a spare memory. The corrected data may then be copied from the temporary location to the memories from which data nibbles will be selected, according to the selection control signals. Such copying may result in default memories between the defective default memories and the spare memory storing different data than that stored when all default memories are functional.

For example, if default memory 306 in memory module 300 is defective, selection control signals may configure data buffer 320 to select data nibbles from default memories 302 and 304, and data buffer 322 to select data nibbles from default memory 308 and spare memory 310. After the corrected data is copied into the appropriate memories, default memory 308 may store a data nibble formerly stored in default memory 306, and spare memory 310 may store a data nibble formerly stored in default memory 308 (default memories 302 and 304 may store the same respective data nibbles as before). Thus, the order of data nibbles in the output of memory module 300 may be the same when spare memory 310 is used as when all default memories are functional (and spare memory 310 is not used).

In some implementations, an external memory controller communicatively coupled to memory module 300 may be informed, for example by machine-readable instructions (e.g., software and/or firmware) on memory module 300, of the presence of a spare memory on memory module 300. In such implementations, the spare memory may store a copy of data stored in a defective default memory, and data buffers on memory module 300 may be configured such that a data nibble is selected from the spare memory instead of the defective default memory. For example, if default memory 304 is defective, spare memory 310 may store a copy of data stored in default memory 304. Data buffer 320 may select a data nibble stored in default memory 302 and a data nibble stored in default memory 306, and data buffer 322 may select a data nibble stored in default memory 308 and spare memory 310. Thus, the data in the memory module output may be "scrambled" when the spare memory is used; when all default memories are functional, a data nibble selected from default memory 304 makes up the last four bits of Byte 0, but when default memory 304 is defective, the information in that data nibble is in the last four bits of Byte 1, and the bits in between are shifted relative to where they would be if all default memories were functional. That is, when all default memories shown in FIG. 3 are functional, the data nibbles selected from default memories 306 and 308 are the first four bits and the last four bits, respectively, of Byte 1, but when default memory 304 is defective, the data nibbles selected from default memories 306 and 308 are the last four bits of Byte 0 and the first four bits of Byte 1, respectively.

The memory controller, having been informed of the presence of a spare memory, may be notified (e.g., when a default memory is determined to be defective) that a data nibble is selected from the spare memory instead of from a defective default memory. The memory controller may "unscramble" the order of data nibbles in the memory module output (e.g., put the data nibbles in the order they would have been in had they all been selected from default memories), then apply error correction logic. In some implementations, erroneous data in the spare memory may be corrected. For example, data stored in the spare memory may be scanned, and EGG logic and/or other suitable error correction logic may be used to detect and correct errors. In some implementations, the entire spare memory may be scanned. In some implementations, a portion of the spare memory, having a copy of data that was stored in a defective portion of a default memory, may be scanned.

Figure 4:
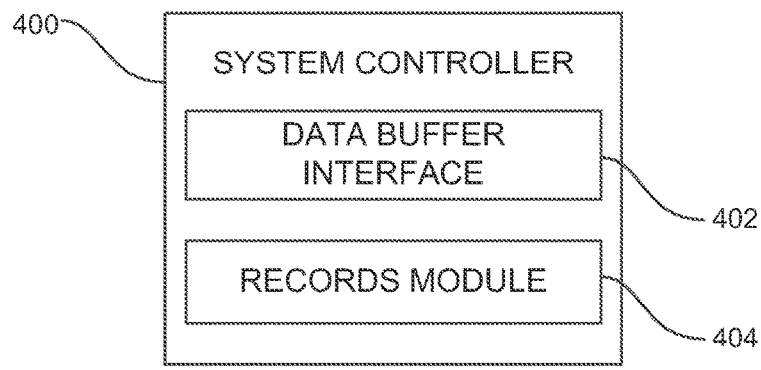
FIG. 4 is a block diagram of an example system controller to enable use of a spare memory on a memory module.

FIG. 4 is a block diagram of an example system controller 400 to enable use of a spare memory on a memory module. System controller 400 may be implemented, for example, as system controller 330. System controller 400 may include modules 402 and 404. A module may include a set of instructions encoded on a machine-readable storage medium and executable by a processor of system controller 400. In addition or as an alternative, a module may include a hardware device comprising electronic circuitry for implementing the functionality described below.

Data buffer interface module 402 may transmit information to data buffers communicatively coupled to system controller 400 on a memory module. Data buffer interface module 402 may transmit selection control signals to data buffers. In some implementations, data buffer interface module 402 may transmit, to data buffers, addresses from which data nibbles should be read. The addresses may be specified by a memory controller external to the memory module.

Records module 404 may maintain records of defective default memories and respective spare memories from which data nibbles are selected instead. The term "maintain", as used herein with respect to records, refers to generating and/or storing new records, updating existing records, and deleting existing records. For example, a memory module may have a first spare memory and a second spare memory. When a first data buffer on the memory module receives, from system controller 400, a first address corresponding to a location in a first defective default memory on the memory module (or a location in a defective portion of a first default memory, as discussed above with respect to FIG. 3), data buffers on the memory module may select a data nibble from the first spare memory instead of the first defective default memory. When a second data buffer on the memory module receives, from system controller 400, a second address corresponding to a location in a second defective default memory (or a location in a defective portion of a second default memory) on the memory module, data buffers on the memory module may select a data nibble from the second spare memory instead of the second defective default memory. Records module 404 may store a record identifying the first default memory (or identifying a defective portion of the first default memory), and identifying the first spare memory as being used to replace the (defective portion of the) first default memory. Records module 404 may also store a record identifying the second default memory (or identifying a defective portion of the second default memory), and identifying the second spare memory as being used to replace the (defective portion of the) second default memory. The records may be maintained in, for example, a read-only memory (ROM) in system controller 400.

Figure 5:
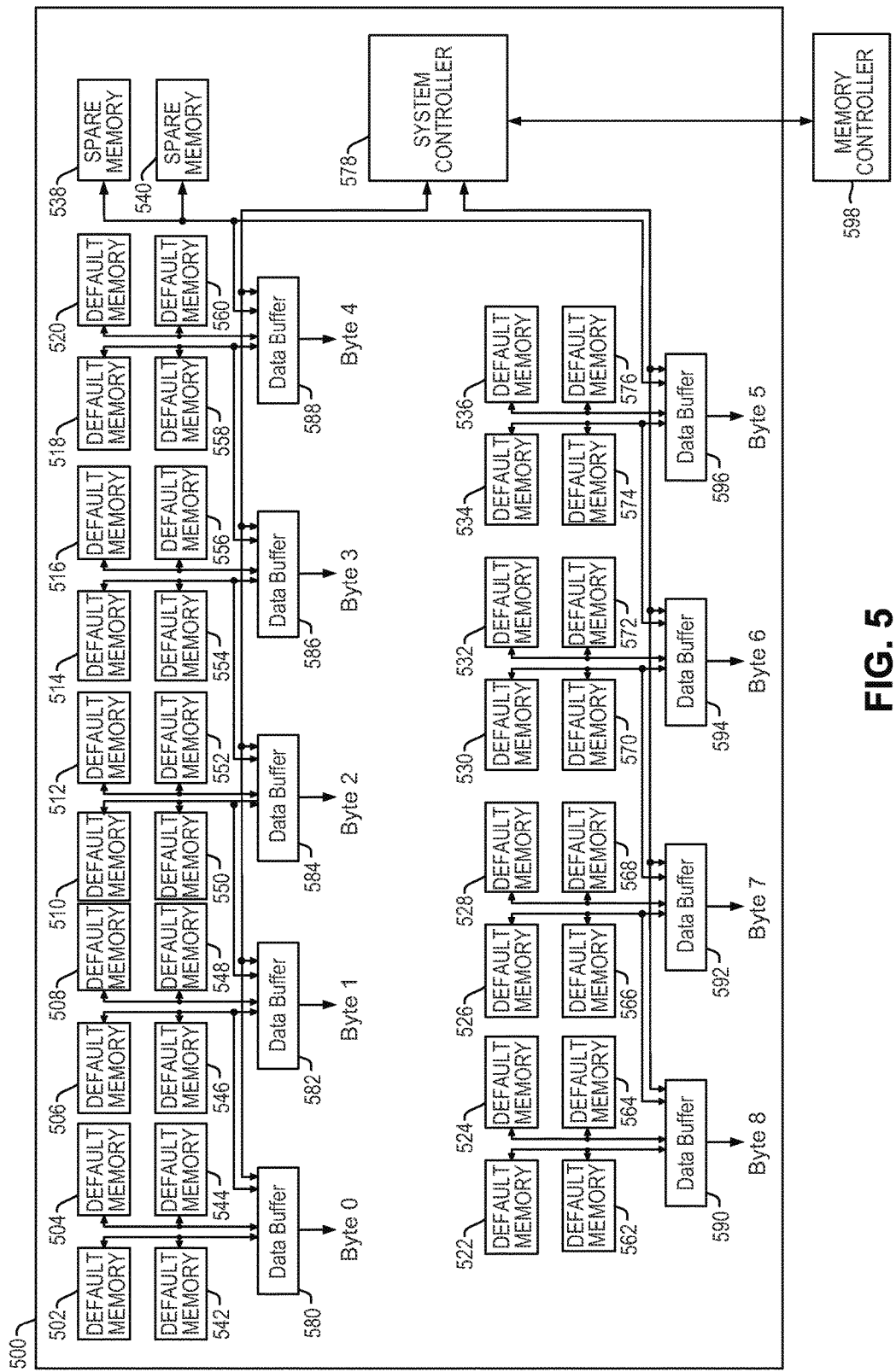
FIG. 5 is a block diagram of an example memory module that includes multiple spare memories.

FIG. 5 is a block diagram of an example memory module 500 that includes multiple spare memories. Memory module 500 may be an in-line memory module, such as a SIMM or DIMM, or any memory module suitable for mounting memory ICs. In FIG. 5, memory module 500 includes default memories 502, 504, 506, 508, 510, 512, 514, 516, 518, 520, 522, 524, 526, 528, 530, 532, 534, 536, 542, 544, 546, 548, 550, 552, 554, 556, 558, 560, 562, 564, 566, 568, 570, 572, 574, and 576, spare memories 538 and 540, data buffers 580, 582, 584, 586, 588, 590, 592, 594, and 596, and system controller 578. System controller 578, which may be implemented as system controller 400, may be communicatively coupled to memory controller 598, which may be external to memory module 500. Memory controller 598 may perform similar functions to an external memory controller discussed above with respect to FIG. 3.

Default memories 502, 504, 506, 508, 510, 512, 514, 516, 518, 520, 522, 524, 526, 528, 530, 532, 534, and 536 may be in a first rank, and default memories 542, 544, 546, 548, 550, 552, 554, 556, 558, 560, 562, 564, 566, 568, 570, 572, 574, and 576 may be in a second rank. A default memory in FIG. 5 may be analogous to a default memory in FIG. 3. Each group of four default memories directly above a data buffer may be housed in a quad die package (QDP). For example, default memories 502, 504, 542, and 544 may be housed in a first QDP, default memories 506, 508, 546, and 548 may be housed in a second QDP, etc.

Spare memories 538 and 540 in FIG. 5 may be analogous to spare memory 310 in FIG. 3. In some implementations, spare memories 538 and 540 may both be in the first rank or may both be in the second rank. In some implementations, spare memory 538 may be in the first rank and spare memory 540 may be in the second rank, or vice-versa. An IC in which spare memories are housed may have a different number of die than the ICs in which default memories are housed.

A data buffer in FIG. 5 may be analogous to a data buffer in FIG. 3. Each data buffer in FIG. 5 may select data nibbles from two memories communicatively coupled to the respective data buffer, in a similar manner as that discussed above with respect to FIG. 3. Data buffers 580, 582, 584, 586, 588, 590, 592, 594, and 596 may receive selection control signals from system controller 578. The memories from which data buffers 580, 582, 584, 586, 588, 590, 592, 594, and 596 select data nibbles may all be in the same rank. For example, if spare memories 538 and 540 are both in the first (or second) rank, up to two defective default memories in the first (or second) rank may be replaced. If spare memory 538 is in the first rank and spare memory 540 is in the second rank, spare memory 538 may be used to replace a defective default memory in the first rank, and spare memory 540 may be used to replace a defective default memory in the second rank.

Figure 6:
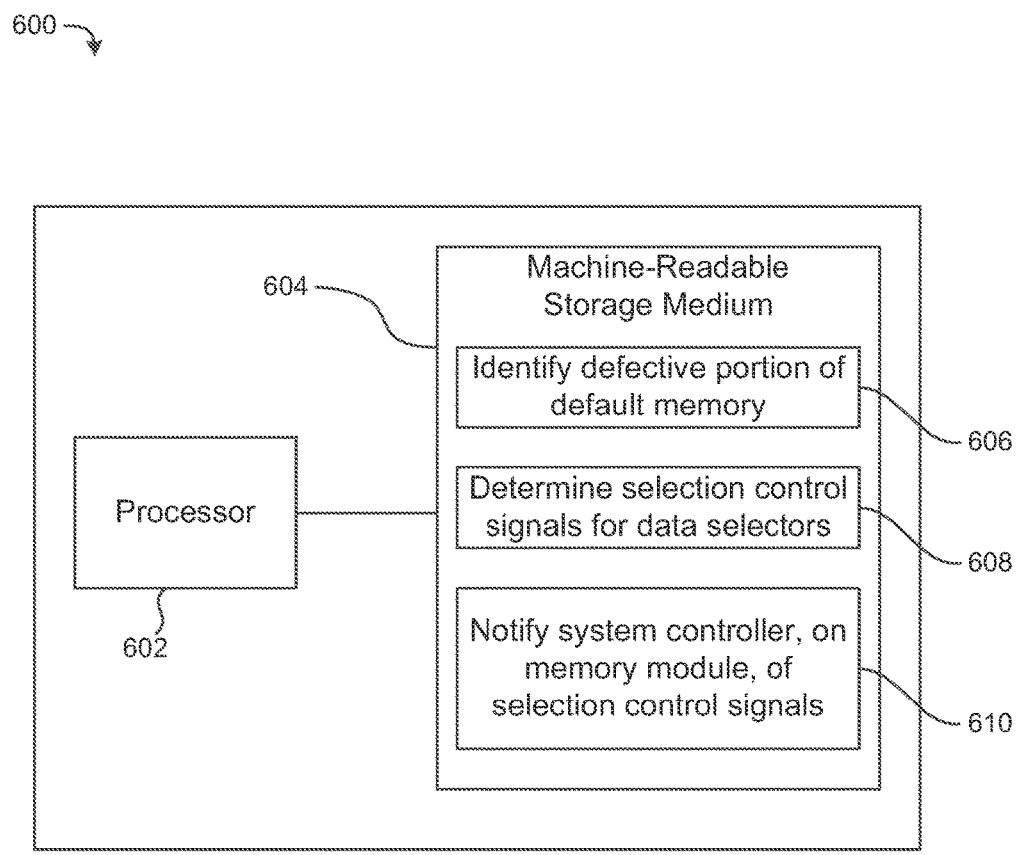
FIG. 6 is a block diagram of an example device that includes a machine-readable storage medium encoded with instructions to enable use of a spare memory on a memory module.

FIG. 6 is a block diagram of an example device 600 that includes a machine-readable storage medium encoded with instructions to enable use of a spare memory on a memory module. Device 600 may be a memory controller, such as memory controller 598. In FIG. 6, device 600 includes processor 602 and machine-readable storage medium 604.

Processor 602 may include a central processing unit (CPU), microprocessor (e.g., semiconductor-based microprocessor), and/or other hardware device suitable for retrieval and/or execution of instructions stored in machine-readable storage medium 604. Processor 602 may fetch, decode, and/or execute instructions 606, 608, and 610 to enable use of a spare memory on a memory module, as described below. As an alternative or in addition to retrieving and/or executing instructions, processor 602 may include an electronic circuit comprising a number of electronic components for performing the functionality of instructions 606, 608, and/or 610.

Machine-readable storage medium 604 may be any suitable electronic, magnetic, optical, or other physical storage device that contains or stores executable instructions. Thus, machine-readable storage medium 604 may include, for example, a random-access memory (RAM), an Electrically Erasable Programmable Read-Only Memory (EEPROM), a storage device, an optical disc, and the like. In some implementations, machine-readable storage medium 604 may include a non-transitory storage medium, where the term "non-transitory" does not encompass transitory propagating signals. As described in detail below, machine-readable storage medium 604 may be encoded with a set of executable instructions 606, 608, and 610.

Instructions 606 may identify a defective portion of a default memory on a memory module. In some implementations, a portion of a default memory may be identified as defective if data stored in/read from the portion of the default memory is repeatedly corrected using ECC logic or other error correction logic. For example, a counter may be incremented each time an error from the portion of the default memory is corrected, and when the value in the counter exceeds a threshold value, the portion of the default memory may be identified as defective. Records of defective DRAMs may be updated (e.g., by records module 404 of FIG. 4) when the portion of the default memory is identified as defective.

Instructions 608 may determine selection control signals for data selectors on a memory module. Selection control signals may be determined such that a data nibble is selected from a spare memory on the memory module and not from a defective default memory. A data nibble selected from the default memory may be in a first position in an output of the memory module when the defective portion is functional. A data nibble selected from the spare memory may be in a second position in the output of the memory module.

Instructions 610 may notify a system controller, on a memory module, of selection control signals. In some implementations, instructions 610 may write selection control signals into internal registers within the system controller. The system controller may be communicatively coupled to data buffers having data selectors.

Figure 7:
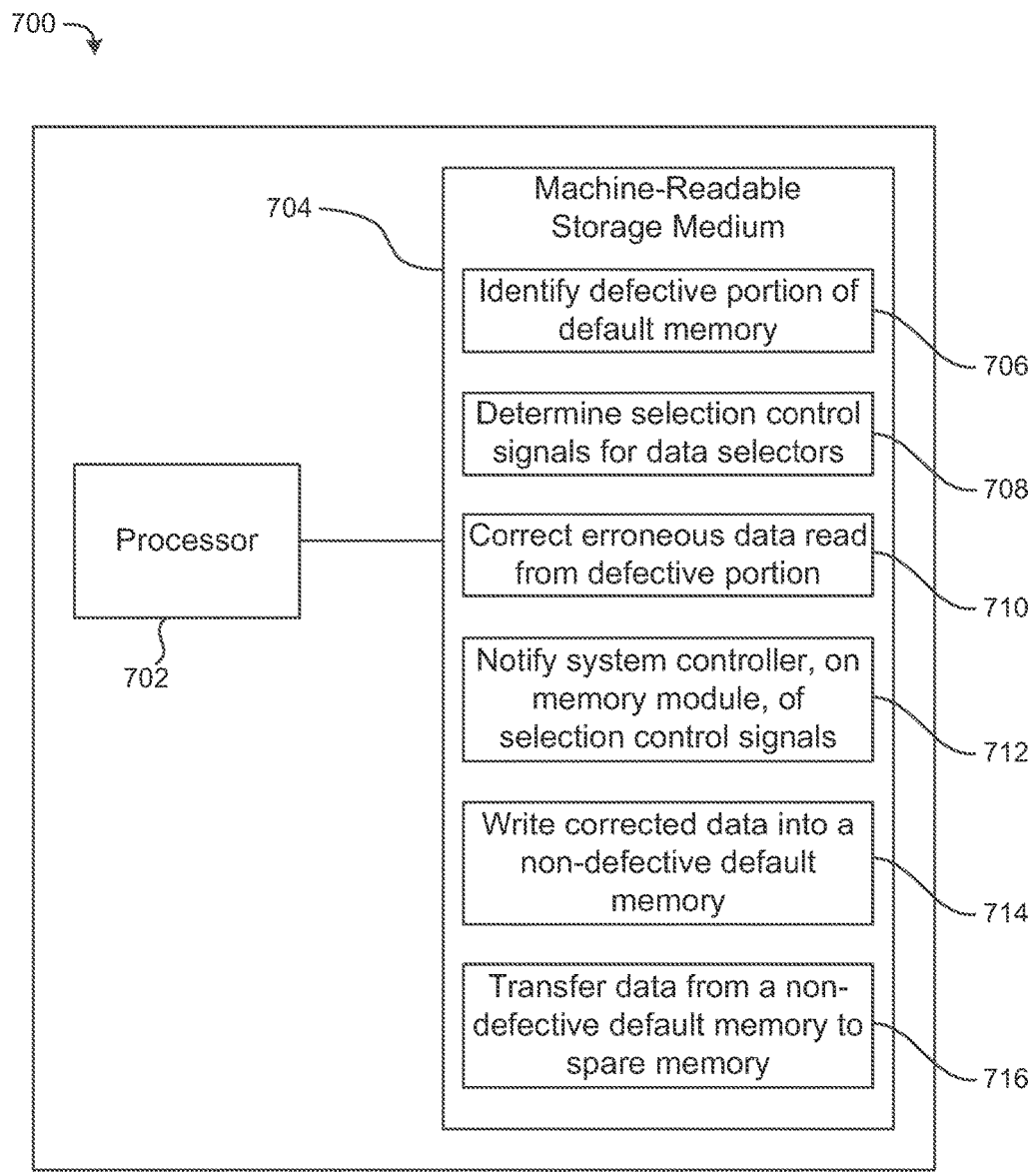
FIG. 7 is a block diagram of an example device that includes a machine-readable storage medium encoded with instructions to copy and correct data stored on a memory module.

FIG. 7 is a block diagram of an example device 700 that includes a machine-readable storage medium encoded with instructions to copy and correct data stored on a memory module. Device 700 may be a memory controller, such as memory controller 598. In FIG. 7, device 700 includes processor 702 and machine-readable storage medium 704.

As with processor 602 of FIG. 6, processor 702 may include a CPU, microprocessor (e.g., semiconductor-based microprocessor), and/or other hardware device suitable for retrieval and/or execution of instructions stored in machine-readable storage medium 704. Processor 702 may fetch, decode, and/or execute instructions 706, 708, 710, 712, 714, and 716 to enable copying and correction of data on a memory module, as described below. As an alternative or in addition to retrieving and/or executing instructions, processor 702 may include an electronic circuit comprising a number of electronic components for performing the functionality of instructions 706, 708, 710, 712, 714, and/or 716.

As with machine-readable storage medium 604 of FIG. 6, machine-readable storage medium 704 may be any suitable physical storage device that stores executable instructions. Instructions 706, 708, and 712 on machine-readable storage medium 704 may be analogous to instructions 606, 608, and 610 on machine-readable storage medium 604. Instructions 710 may correct erroneous data read from a defective portion of a default memory on a memory module. For example, the erroneous data may be corrected using ECC logic and/or other suitable error correction logic.

Instructions 714 may write corrected data into a non-defective default memory on the memory module. The corrected data may be stored in a temporary location, such as a virtual memory or disk drive, with data copied from other non-defective default memories. The corrected data may be copied from the temporary location and written into a non-defective default memory from which a data nibble will be selected, in accordance with determined selection control signals. The non-defective default memory to which the corrected data is copied may store different data when all default memories are functional, as discussed above with respect to FIG. 3.

Instructions 716 may transfer data from a non-defective default memory to a spare memory on the memory module. A first data nibble may be copied from a first non-defective default memory and stored in a temporary location, such as a virtual memory or disk drive. The temporary location may also store a second data nibble copied from a second non-defective default memory, and corrected data from a defective default memory. The first data nibble may be copied from the temporary location and written into a spare memory. When the first data nibble is written into the spare memory, the second data nibble may be written into the first non-defective default memory.

Figure 8:
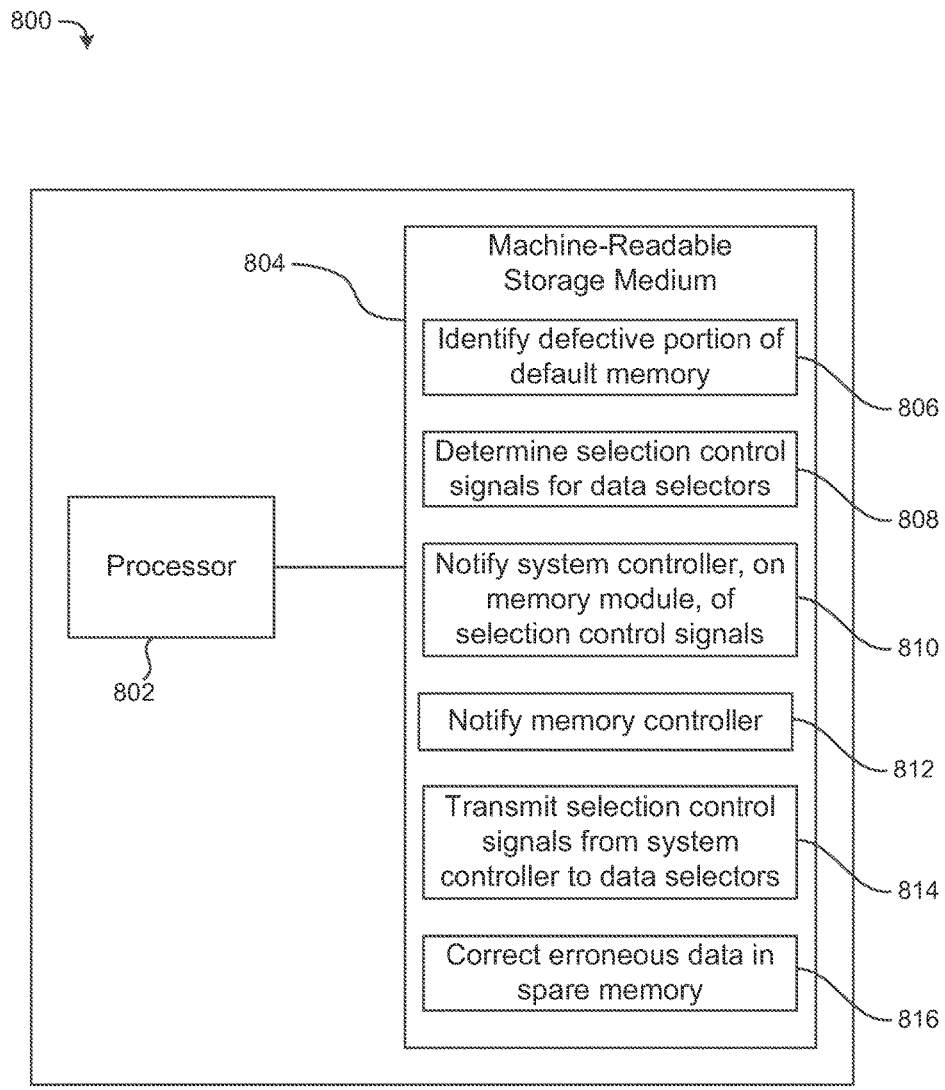
FIG. 8 is a block diagram of an example device that includes a machine-readable storage medium encoded with instructions to notify a memory controller of use of a spare memory on a memory module and to correct erroneous data in the spare memory.

FIG. 8 is a block diagram of an example device 800 that includes a machine-readable storage medium encoded with instructions to notify a memory controller of use of a spare memory on a memory module and to correct erroneous data in the spare memory. Device 800 may be a memory controller, such as memory controller 598. In FIG. 8, device 800 includes processor 802 and machine-readable storage medium 804.

As with processor 602 of FIG. 6, processor 802 may include a CPU, microprocessor (e.g., semiconductor-based microprocessor), and/or other hardware device suitable for retrieval and/or execution of instructions stored in machine-readable storage medium 804. Processor 802 may fetch, decode, and/or execute instructions 806, 808, 810, 812, 814, and 816 to enable notifying a memory controller of use of a spare memory and correcting data in the spare memory, as described below. As an alternative or in addition to retrieving and/or executing instructions, processor 802 may include an electronic circuit comprising a number of electronic components for performing the functionality of instructions 806, 808, 810, 812, 814, and/or 816.

As with machine-readable storage medium 604 of FIG. 6, machine-readable storage medium 804 may be any suitable physical storage device that stores executable instructions. Instructions 806, 808, and 810 on machine-readable storage medium 804 may be analogous to instructions 606, 608, and 610 on machine-readable storage medium 604. Instructions 812 may notify a memory controller, external to a memory module, of selection control signals determined by instructions 808. Instructions 812 may thus notify the memory controller that a data nibble is selected from a spare memory instead of a defective default memory. The spare memory may store a copy of data stored in a defective portion of the default memory.

Instructions 814 may transmit selection control signals from a system controller on a memory module to data selectors on the memory module. The selection control signals may be used to configure the data selectors, which may be in data buffers on the memory module. The selection control signals may be transmitted from the system controller to the data selectors via a data bus.

Instructions 816 may correct erroneous data in a spare memory on a memory module. For example, data stored in the spare memory may be scanned, and ECC logic and/or other suitable error correction logic may be used to detect and correct errors. In some implementations, the entire spare memory may be scanned. In some implementations, a portion of the spare memory, having a copy of data that was stored in a defective portion of a default memory, may be scanned.

Figure 9:
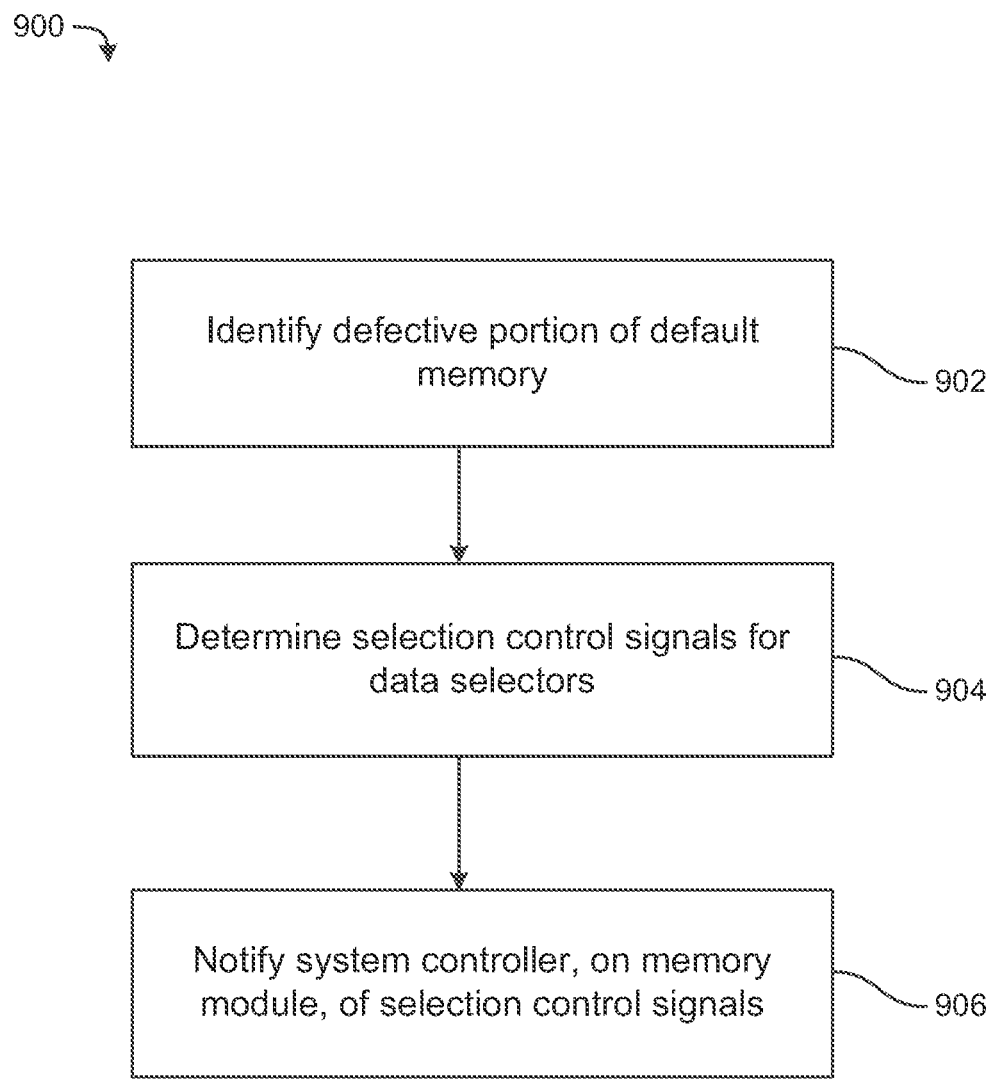
FIG. 9 is a flowchart of an example method for using a spare memory on a memory module.

FIG. 9 is a flowchart of an example method 900 for using a spare memory on a memory module. Although execution of method 900 is described below with reference to processor 602 of FIG. 6, it should be understood that execution of method 900 may be performed by other suitable devices, such as processors 702 and 802 of FIGS. 7 and 8, respectively. Method 900 may be implemented in the form of executable instructions stored on a machine-readable storage medium and/or in the form of electronic circuitry.

Method 900 may start in block 902, where processor 602 may identify a defective portion of a default memory. In some implementations, a portion of a default memory may be identified as defective if data stored in/read from the portion of the default memory is repeatedly corrected using ECC logic or other error correction logic. For example, a counter may be incremented each time an error from the portion of the default memory is corrected, and processor 602 may monitor the value in the counter. When the value in the counter exceeds a threshold value, processor 602 may identify the portion of the default memory as defective.

Next, in block 904, processor 602 may determine selection control signals for data selectors on the memory module. Selection control signals may be determined such that a data nibble is selected from a spare memory on the memory module and not from a defective default memory. A data nibble selected from the default memory may be in a first position in an output of the memory module when the defective portion is functional. A data nibble selected from the spare memory may be in a second position in the output of the memory module.

Finally, in block 906, processor 602 may notify a system controller, on the memory module, of the selection control signals. In some implementations, processor 602 may write selection control signals into internal registers within the system controller. The system controller may be communicatively coupled to data buffers having data selectors.

Figure 10:
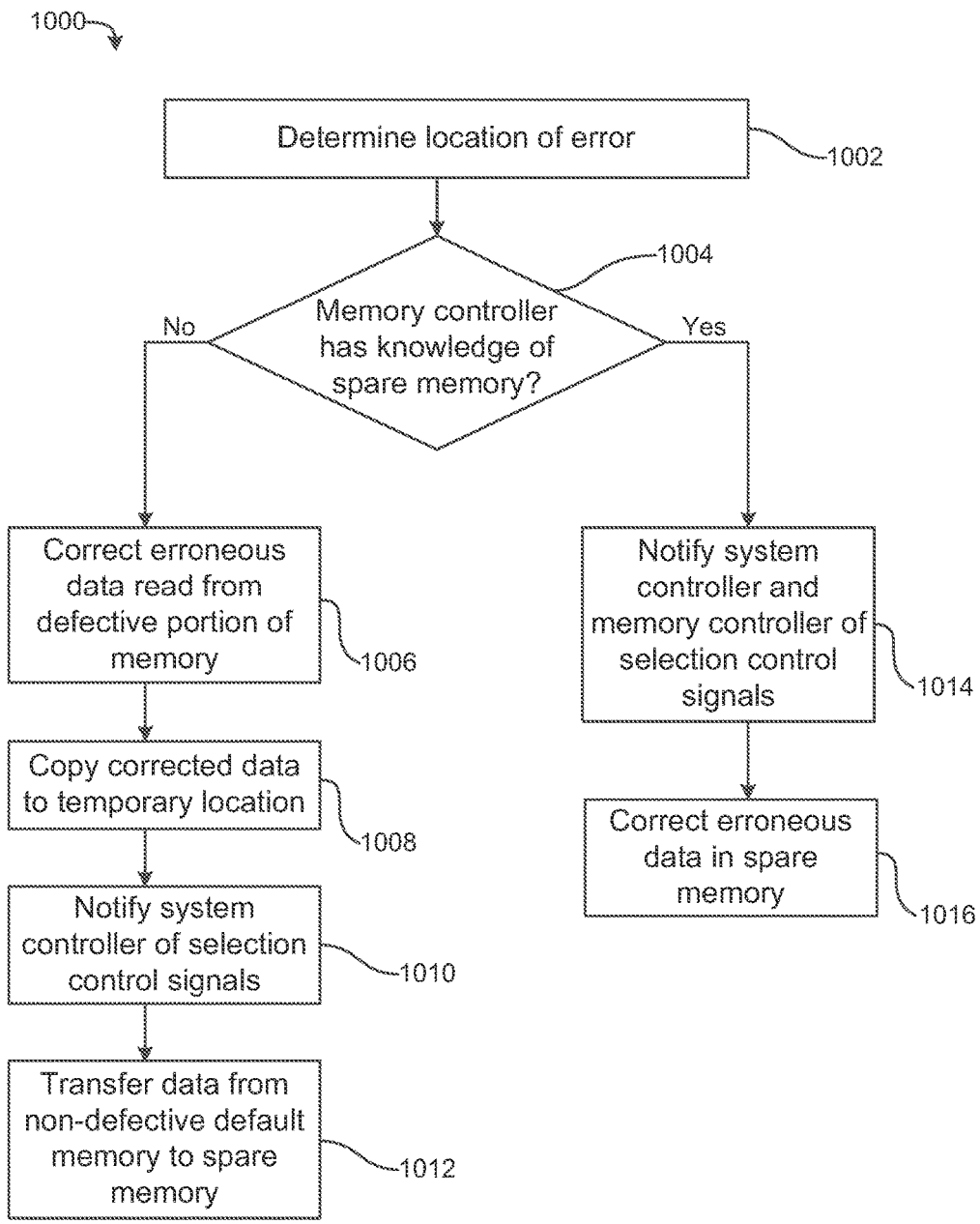
FIG. 10 is a flowchart of an example method for correcting erroneous data stored on a memory module.

FIG. 10 is a flowchart of an example method 1000 for correcting erroneous data stored on a memory module. Although execution of method 1000 is described below with reference to processor 602 of FIG. 6, it should be understood that execution of method 1000 may be performed by other suitable devices, such as processors 702 and 802 of FIGS. 7 and 8, respectively. Method 1000 may be implemented in the form of executable instructions stored on a machine-readable storage medium and/or in the form of electronic circuitry.

Method 1000 may start in block 1002, where processor 602 may determine the location of an error. For example, processor 602 may determine which byte or data nibble in an output of a memory module contains an error. In some implementations, processor 602 may determine an address range in a memory from which erroneous data was read. For example, processor 602 may determine a rank, bank group, bank, and/or row of the memory from which erroneous data was read.

In block 1004, processor 602 may determine whether a memory controller has knowledge of a spare memory on the memory module. If the memory controller does not have knowledge of a spare memory, method 1000 may proceed to block 1006, in which processor 602 may correct erroneous data read from a defective portion of a default memory. For example, processor 602 may correct erroneous data using ECC logic and/or other suitable error correction logic.

In block 1008, processor 602 may copy the corrected data to a temporary location. The temporary location may include a disk drive, virtual memory, and/or buffer. In some implementations, processor 602 may copy data from non-defective default memories to the temporary location. The temporary location may be on the memory controller and/or on the memory module.

In block 1010, processor 602 may notify a system controller on the memory module of selection control signals. In some implementations, processor 602 may write selection control signals into internal registers within the system controller. The system controller may be communicatively coupled to data buffers having data selectors.

In block 1012, processor 602 may transfer data from a non-defective default memory to a spare memory on the memory module. For example, a first data nibble may be copied from a first non-defective default memory and stored in the temporary location of block 1008. Processor 602 may copy the first data nibble from the temporary location and write the first data nibble into a spare memory. When processor 602 writes the first data nibble into the spare memory, processor 602 may also write the corrected data of block 1008 to the first non-defective default memory or another non-defective default memory.

If, in block 1004, processor 602 determines that the memory controller does have knowledge of a spare memory, method 1000 may proceed to block 1014, at which processor 602 may notify the system controller and memory controller of selection control signals. Processor 602 may write selection control signals into internal registers within the system controller as well as into registers within the memory controller. After being notified of the spare memory, the memory controller may be able to "unscramble" the order of data nibbles in the memory module output (e.g., put the data nibbles in the order they would have been in had they all been selected from default memories), then apply error correction logic, as discussed above with respect to FIG. 3.

Next, in block 1016, processor 602 may correct erroneous data in the spare memory. For example, processor 602 may scan data stored in the spare memory, and ECC logic and/or other suitable error correction logic may be used to detect and correct errors. In some implementations, the entire spare memory may be scanned. In some implementations, a portion of the spare memory, having a copy of data that was stored in a defective portion of a default memory, may be scanned.

The foregoing disclosure describes memory modules having data buffers with data selectors. When all default memories on a memory module are functional, data selectors on the memory module may select data nibbles from the default memories. When a default memory on the memory module is defective, the data selectors may select a data nibble from a spare memory and may not select a data nibble from the defective default memory.

We claim:

1. An in-line memory module comprising:
    a first memory, a second memory, and a third memory; and
    a data buffer comprising:
        a first data selector to select between a first data nibble stored in the first memory and a second data nibble stored in the second memory; and
        a second data selector to select between a third data nibble stored in the third memory and the second data nibble; wherein:
        in response to the first memory and the second memory being functional, the first and second data selectors are to select the first and second data nibbles, respectively;
        in response to the first memory being not functional and the second memory being functional, the first and second data selectors are to select the second and third data nibbles, respectively;
        in response to the first memory being functional and the second memory being not functional, the first and second data selectors are to select the first and third data nibbles, respectively; and
        an output of the data buffer comprises data nibbles selected by the first and second data selectors; and
    wherein the third memory is a spare memory, wherein first data bits of the output of the data buffer comprising data nibbles selected by the first and second data selectors responsive to the first and second memories being functional are shifted relative to second data bits of the output of the data buffer comprising data nibbles selected by the first and second data selectors responsive to the first memory being non-functional and the second memory being functional.

2. The memory module of claim 1, wherein the data buffer further comprises:
    a first register to store an output of the first data selector, wherein the output of the first data selector comprises a data nibble selected by the first data selector; and
    a second register to store an output of the second data selector, wherein the output of the second data selector comprises a data nibble selected by the second data selector; wherein:

the first and second registers are to output their respective stored data nibbles; and the output of the data buffer comprises the data nibbles output by the first and second registers.

3. The memory module of claim 1, wherein:

the data buffer, the first memory, the second memory, and the third memory are on integrated circuits on the memory module, and the memory module further comprises:

a system controller to provide selection control signals to the first and second data selectors, the selection control signals to control selection from among nibbles of the first, second, and third memories by the first and second data selectors.

4. The memory module of claim 1, further comprising:

pins on the memory module to output, from the memory module to a controller external of the memory module, the data nibbles selected by the first and second data selectors.

5. The memory module of claim 1, wherein the first data bits are shifted relative to the second data bits by one nibble.

6. The memory module of claim 1, the memory module further comprising:

machine-readable instructions executable on a processor of the memory module to inform a memory controller external of the memory module of use of the spare memory, responsive to the first memory or the second memory being not functional.

7. A non-transitory machine-readable storage medium encoded with instructions executable by a memory controller for using a spare memory on a memory module that is separate from the memory controller, wherein a plurality of memories on the memory module comprise default memories and the spare memory, the instructions when executed causing the memory controller to:

identify a defective portion of a first memory of the default memories, wherein a data nibble selected from the first memory on the memory module is in a first position in an output of the memory module when the first memory is functional;

in response to identifying the defective portion of the first memory, determine selection control signals for data selectors on the memory module such that a data nibble is selected from the spare memory on the memory module and not from the first memory, wherein the data nibble selected from the spare memory is in a second position in the output of the memory module;

notify a system controller, on the memory module, of the selection control signals;

receive a notification from the memory module that a data nibble is selected from the spare memory instead of the first memory, wherein the spare memory stores a copy of data stored in the defective portion of the first memory; and unscramble the output, of the memory module, including the data nibble from the spare memory, to produce an order of data nibbles corresponding to the output of the memory module produced when all data nibbles are selected from the default memories; and wherein in response to the selection control signals, the data selectors select data nibbles from the spare memory and default memories other than the first memory such that data nibbles between the first position and the second position in the output of the memory module are shifted relative to an output of the memory module produced when all data nibbles are selected from the default memories.

8. The non-transitory machine-readable storage medium of claim 7, wherein the instructions when executed cause the memory controller to:

correct erroneous data read from the defective portion of the first memory, to produce corrected data;

write the corrected data into a second memory of the default memories; and transfer data from a non-defective one of the default memories to the spare memory.

* * * * *